(12) United States Patent
Tang

(10) Patent No.: US 11,563,930 B2
(45) Date of Patent: Jan. 24, 2023

(54) LASER PROJECTION COMPONENT, DETECTION METHOD THEREOF, AND ELECTRONIC DEVICE

(71) Applicant: GUANGDONG OPPO MOBILE TELECOMMUNICATIONS CORP., LTD., Guangdong (CN)

(72) Inventor: Cheng Tang, Guangdong (CN)

(73) Assignee: GUANGDONG OPPO MOBILE TELECOMMUNICATIONS CORP., LTD., Guangdong (CN)

(*) Notice: Subject to any disclaimer, the term of this patent is extended or adjusted under 35 U.S.C. 154(b) by 443 days.

(21) Appl. No.: 16/683,983

(22) Filed: Nov. 14, 2019

(65) Prior Publication Data
US 2020/0084439 A1 Mar. 12, 2020

Related U.S. Application Data

(63) Continuation of application No. PCT/CN2019/076076, filed on Feb. 25, 2019.

(30) Foreign Application Priority Data

Mar. 12, 2018 (CN) .............................. 201810200489
Mar. 12, 2018 (CN) .............................. 201810201758
Mar. 12, 2018 (CN) .............................. 201810201760

(51) Int. Cl.
*H04N 7/00* (2011.01)
*H04N 17/00* (2006.01)
(Continued)

(52) U.S. Cl.
CPC ......... *H04N 17/002* (2013.01); *G01S 7/4802* (2013.01); *G01S 7/497* (2013.01);
(Continued)

(58) Field of Classification Search
None
See application file for complete search history.

(56) References Cited

U.S. PATENT DOCUMENTS 8,492,696 B2 7/2013 Akerman et al.
2006/0126362 A1* 6/2006 Hsieh .................. G02B 6/0091
362/633
(Continued)

FOREIGN PATENT DOCUMENTS

CN 1900759 1/2007
CN 100520376 7/2009
(Continued)

OTHER PUBLICATIONS

EPO, Office Action for EP Application No. 19725915.3, dated Nov. 21, 2019.
(Continued)

*Primary Examiner* — Stuart D Bennett
(74) *Attorney, Agent, or Firm* — Hodgson Russ LLP

(57) ABSTRACT

The present disclosure provides a laser projection component and a detection method thereof, and an electronic device. The laser projection component is applicable to the depth camera component and is configured to project a laser pattern. The detection method includes: obtaining the laser pattern; determining whether a preset identifier exists in the laser pattern; and determining that the depth camera component is abnormal when the preset identifier does not exist in the laser pattern.

19 Claims, 14 Drawing Sheets

(51) Int. Cl.
   *G06T 7/80*      (2017.01)
   *G06T 7/70*      (2017.01)
   *G01S 17/86*     (2020.01)
   *G01S 7/48*      (2006.01)
   *G01S 7/497*     (2006.01)
   *G01S 17/48*     (2006.01)
   *G02B 27/30*     (2006.01)
   *G02B 27/42*     (2006.01)
   *H04N 5/232*     (2006.01)
   *H04N 5/247*     (2006.01)
   *G06V 40/16*     (2022.01)
   *H01S 5/024*     (2006.01)
   *H01S 5/12*      (2021.01)
   *H01S 5/02355*   (2021.01)

(52) U.S. Cl.
   CPC .............. *G01S 17/48* (2013.01); *G01S 17/86* (2020.01); *G02B 27/30* (2013.01); *G02B 27/4205* (2013.01); *G06T 7/70* (2017.01); *G06T 7/80* (2017.01); *G06V 40/161* (2022.01); *H04N 5/23219* (2013.01); *H04N 5/247* (2013.01); *G06T 2207/10028* (2013.01); *G06T 2207/30201* (2013.01); *H01S 5/02355* (2021.01); *H01S 5/02469* (2013.01); *H01S 5/12* (2013.01)

(56) References Cited

U.S. PATENT DOCUMENTS

| | | | |
|---|---|---|---|
| 2009/0237629 A1 | 9/2009 | Koo | |
| 2014/0168565 A1* | 6/2014 | Wu | G02B 6/009 362/633 |
| 2014/0240646 A1* | 8/2014 | Ma | G02F 1/13471 445/24 |
| 2015/0049173 A1 | 2/2015 | Kim et al. | |
| 2017/0188016 A1 | 6/2017 | Hudman et al. | |
| 2017/0194768 A1 | 7/2017 | Powers et al. | |
| 2018/0176544 A1* | 6/2018 | Wang | H04N 5/232 |

FOREIGN PATENT DOCUMENTS

| | | |
|---|---|---|
| CN | 101482691 | 7/2009 |
| CN | 203133473 | 8/2013 |
| CN | 203385981 | 1/2014 |
| CN | 103679056 | 3/2014 |
| CN | 104125455 | 10/2014 |
| CN | 204156937 | 2/2015 |
| CN | 204269928 | 4/2015 |
| CN | 105004282 | 10/2015 |
| CN | 105306922 | 2/2016 |
| CN | 105554486 | 5/2016 |
| CN | 105959659 | 9/2016 |
| CN | 106052757 | 10/2016 |
| CN | 106296716 | 1/2017 |
| CN | 106568396 | 4/2017 |
| CN | 106595482 | 4/2017 |
| CN | 206209271 | 5/2017 |
| CN | 106990659 | 7/2017 |
| CN | 107102506 | 8/2017 |
| CN | 107167996 | 9/2017 |
| CN | 107229173 | 10/2017 |
| CN | 107463902 | 12/2017 |
| CN | 107608167 | 1/2018 |
| CN | 107636508 | 1/2018 |
| CN | 206877018 | 1/2018 |
| CN | 206877030 U | 1/2018 |
| CN | 107770301 | 3/2018 |
| CN | 107783361 | 3/2018 |
| CN | 108507761 | 9/2018 |
| CN | 108508620 | 9/2018 |
| CN | 108508624 | 9/2018 |
| DE | 102017102998 | 2/2018 |
| JP | 2011222921 | 11/2011 |
| WO | 2016202295 | 12/2016 |

OTHER PUBLICATIONS

SIPO, First Office Action for CN Application No. 201810200489.5, dated May 17, 2019.
SIPO, Second Office Action for CN Application No. 201810200489.5, dated Aug. 12, 2019.
SIPO, First Office Action for CN Application No. 201810201760.7, dated May 28, 2019.
SIPO, Second Office Action for CN Application No. 201810201760.7, dated Aug. 14, 2019.
SIPO, Second Office Action for CN Application No. 201810201758.X, dated Jun. 28, 2019.
WIPO, English Translation of the ISR and WO for PCT/CN2019/076076, Jun. 3, 2019.
SIPO, First Office Action for CN Application No. 201810201758.X, dated Apr. 9, 2019.
IPI, Office Action for IN Application No. 201917021985, dated Jan. 27, 2021.

* cited by examiner

US 11,563,930 B2

LASER PROJECTION COMPONENT, DETECTION METHOD THEREOF, AND ELECTRONIC DEVICE

CROSS-REFERENCE TO RELATED APPLICATIONS

This application is a Continuation of International Application No. PCT/CN2019/076076, filed on Feb. 25, 2019, which claims priority to Chinese Patent Applications Nos. 201810201758.X, 201810201760.7 and 201810200489.5, each filed on Mar. 12, 2018. The entire disclosures of the aforementioned applications are incorporated herein by reference.

TECHNICAL FIELD

The present disclosure relates to a field of imaging technology, and more particularly, to a detection method of a laser projection component a laser projection component, and an electronic device.

BACKGROUND

A depth camera component uses a light source of a laser projection component to emit laser light, thereby assisting an infrared camera to obtain a structured light image. Under normal circumstances, the energy of the laser light emitted by the light source is attenuated after passing through an optical system (e.g. a collimating element, a diffractive optical element), thus causing no harm to the human body.

SUMMARY

Embodiments of the present disclosure provide a detection method of a laser projection component, a laser projection component, and an electronic device.

The detection method of a laser projection component according to an embodiment of the present disclosure is applicable to a laser projection component, in which the laser projection component is applied in a depth camera component and is configured to project a laser pattern. The detection method includes: obtaining the laser pattern; determining whether a preset identifier exists in the laser pattern; and determining that the depth camera component is abnormal when the preset identifier does not exist in the laser pattern.

The laser projection component according to an embodiment of the present disclosure includes a diffractive optical element and a processor. The diffractive optical element is configured to diffract laser light to generate a laser pattern. The processor is configured to obtain the laser pattern, determine whether a preset identifier exists in the laser pattern, and determine that the diffractive optical element is abnormal when the preset identifier does not exist in the laser pattern.

The electronic device according to an embodiment of the present disclosure includes a visible light camera component, a depth camera component and a processor. The depth camera component includes a laser projection component and an image collector. A field of view of the visible light camera component and a field of view of the image collector are at least partially overlapped, and the laser projection component is configured to project a laser pattern. The processor is configured to obtain a visible light image collected by the visible light camera component, determine whether a human face exists in the visible light image, and obtain the laser pattern collected by the image collector when the human face exists in the visible light image, determine whether a preset identifier exists in the laser pattern, and determine that the depth camera component is abnormal when the preset identifier does not exist in the laser pattern.

Additional aspects and advantages of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
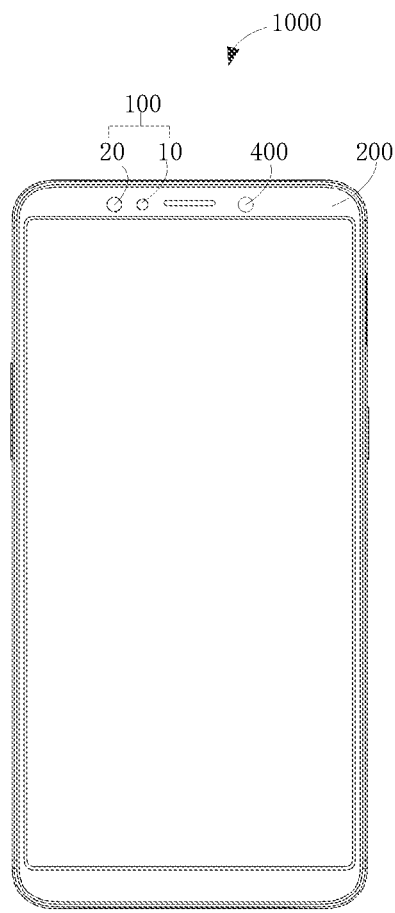
FIG. 1 is a plane sketch of an electronic device according to an embodiment of the present disclosure.

Embodiments of the present disclosure will be described in detail and examples of embodiments are illustrated in the drawings. The same or similar elements and the elements having the same or similar functions are denoted by like reference numerals throughout the descriptions. Embodiments described herein with reference to drawings are explanatory, serve to explain the present disclosure, and are not construed to limit embodiments of the present disclosure.

In the description of the present disclosure, it is to be understood that, terms such as "center", "longitudinal", "lateral", "length", "width", "thickness", "over", "below", "front", "back", "left", "right", "vertical", "horizontal", "top", "bottom", "in", "out", "clockwise", "anti-clockwise", "axial", "radial" and "circumference" refer to the directions and location relations which are the directions and location relations shown in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure. In addition, terms such as "first" and "second" are used herein for purposes of description and are not intended to indicate or imply relative importance or significance. Furthermore, the feature defined with "first" and "second" may comprise one or more this feature distinctly or implicitly. In the description of the present disclosure, "a plurality of" means two or more than two, unless specified otherwise.

In the present disclosure, unless specified or limited otherwise, the terms "mounted," "connected," "coupled" and "fixed" are understood broadly, such as fixed, detachable mountings, connections and couplings or integrated, and can be mechanical or electrical mountings, connections and couplings, and also can be direct and via media indirect mountings, connections, and couplings, and further can be inner mountings, connections and couplings of two components or interaction relations between two components, which can be understood by those skilled in the art according to the detail embodiment of the present disclosure.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

As illustrated in FIG. 1, the electronic device 1000 includes a depth camera component 100 and a visible light camera component 400. The depth camera component 100 includes a laser projection component 10 and an image collector 20. The fields of view of the visible light camera component 400 and the image collector 20 are at least partially overlapped, and the laser projection component 10 is configured to project a laser pattern. In an example, laser light projected by the laser projection component 10 is infrared light, and the image collector 20 is an infrared camera. The visible light camera component 400 may be a camera capable of collecting visible light to generate an image. The visible light camera may be configured to obtain black-and-white images or color images.

The fields of view of the visible light camera component 400 and the image collector 20 are at least partially overlapped, which can be understood that the fields of view of the visible light camera component 400 and the image collector 20 are completely overlapped, or the fields of view of the visible light camera component 400 and the image collector 20 are partially overlapped. In some embodiments, the visible light camera component 400 and the image collector 20 are both disposed on a front side (a front camera) of the electronic device 1000. Certainly, the visible light camera component 400 and the image collector 20 may also be disposed on a back side (a rear camera) of the electronic device 1000, which is not limited herein.

The electronic device 1000 may be a mobile phone, a tablet computer, a laptop computer, a game machine, a head display device, an access control system, a teller machine, which is not limited herein. The depth camera component 100 and the visible light camera component 400 are both disposed in a housing 200 of the electronic device 1000 and exposed from the housing 200. The housing 200 can provide protection against dust, water, and falling for the depth camera component 100. The housing 200 is provided with a hole corresponding to the depth camera component 100 and the visible light camera component 400 to allow light to enter into or exit from the housing 200.

Figure 2:
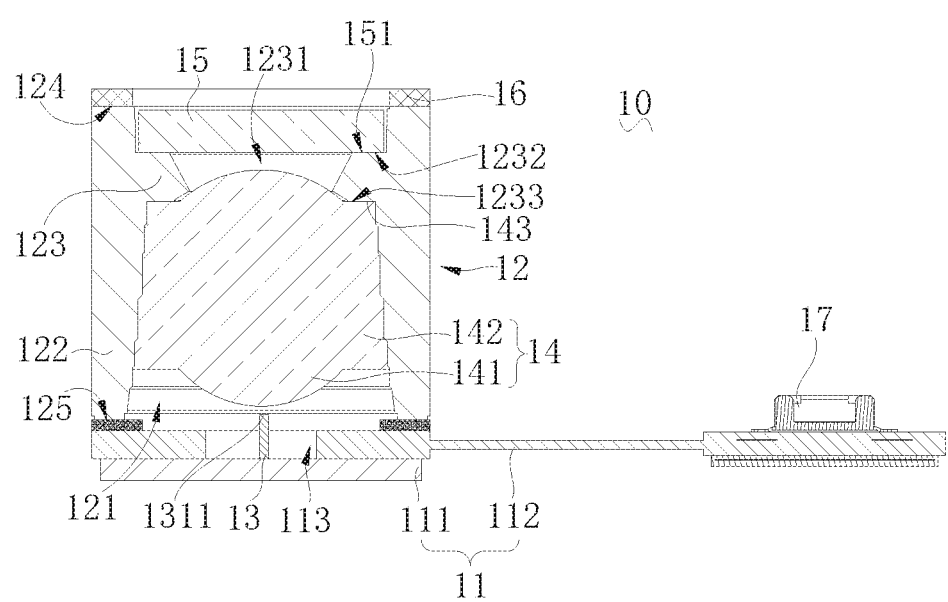
FIGS. 2 to 5 are schematic diagrams of a laser projection component according to embodiments of the present disclosure.

As illustrated in FIG. 2, the laser projection component 10 includes a substrate assembly 11, a lens barrel 12, a light source 13, a collimating element 14 and a diffractive optical element 15. The light source 13, the collimating element 14 and the diffractive optical element 15 are sequentially disposed on a light path of the light source 13, and the light emitted from the light source 13 sequentially passes through the collimating element 14 and the diffractive optical element 15.

The substrate assembly 11 includes a substrate 111 and a circuit board 112 carried on the substrate 111. The substrate 111 is configured to carry the lens barrel 12, the light source 13 and the circuit board 112. The material of the substrate 111 may be plastic, such as at least one of polyethylene glycol terephthalate (PET), polymethyl methacrylate (PMMA), polycarbonate (PC), and polyimide (PI). That is, the substrate 111 can be made of a single plastic material of any one of PET, PMMA, PC and PI. In this manner, the substrate 111 is lighter in weight and has sufficient support strength.

The circuit board 112 may be any one of a printed circuit board, a flexible circuit board, and a soft and hard board. The circuit board 112 may be provided with a via hole 113. The via hole 113 may be used for accommodating the light source 13. A part of the circuit board 112 is covered by the lens barrel 12, and the other part is extended out of the lens barrel 12 and coupled to a connector 17. The connector 17 is configured to couple the laser projection component 10 to other electronic elements (e.g. a main board of the electronic device 1000 illustrated in FIG. 1).

The lens barrel 12 is disposed on the substrate assembly 11 and forms a receiving cavity 121 together with the substrate assembly 11. The lens barrel 12 may be coupled to the circuit board 112 of the substrate assembly 11, and the lens barrel 12 is coupled to the circuit board 112 by viscose to improve the airtightness of the receiving cavity 121. The lens barrel 12 and the substrate assembly 11 may be coupled by other connection manner, for example, by snap connection. The receiving cavity 121 is configured to accommodate components such as the collimating element 14 and the diffractive optical element 15, and the receiving cavity 121 simultaneously forms a part of the light path of the laser projection component 10. In embodiments of the present disclosure, the lens barrel 12 is in a hollow cylindrical shape, and includes a side wall 122 and a limiting protrusion 123.

The side wall 122 of the lens barrel encloses the receiving cavity 121, and an outer wall of the side wall 122 of the lens barrel may be formed with a positioning structure and a mounting structure to facilitate mounting of the laser projection component 10 (e.g. mounting at a predetermined position within the electronic device 1000). The lens barrel 12 includes a first surface 124 and a second surface 125 opposed thereto. An opening of the receiving cavity 121 is opened on the second surface 125 and the other opening is opened on the first surface 124. The second surface 125 is attached to the circuit board 112 by, for example, gluing.

As illustrated in FIG. 2, the limiting protrusion 123 protrudes inwardly from the side wall 122 of the lens barrel. In detail, the limiting protrusion 123 protrudes from the side wall 122 of the lens barrel into the receiving cavity 121. The limiting protrusion 123 may be continuous annular, or there may be a plurality of limiting protrusions 123. The plurality of the limiting protrusions 123 are spaced apart. The limiting protrusion 123 may be used to form a light passing hole 1231. The light passing hole 1231 can serve as a part of the receiving cavity 121. The laser light passes through the light passing hole 1231 and enters the diffractive optical element 15. The limiting protrusion 123 includes a first limiting surface 1232 and a second limiting surface 1233. The first limiting surface 1232 is opposite to the second limiting surface 1233. In detail, the limiting protrusion 123 is located between the first surface 124 and the second surface 125. The first limiting surface 1232 is closer to the first surface 124 than the second limiting surface 1233. The first limiting surface 1232 and the second limiting surface 1233 can be parallel planes. The receiving cavity 121 between the first limiting surface 1232 and the first surface 124 can be used for accommodating the diffractive optical element 15. The receiving cavity 121 between the second limiting surface 1233 and the second surface 125 can be used for accommodating the collimating element 14.

The light source 13 is disposed on the substrate assembly 11. In detail, the light source 13 can be disposed on the circuit board 112 and electrically connected to the circuit board 112. The light source 13 can also be disposed on the substrate 111 and received in the via hole 113. In this case, the light source 13 is electrically connected to the circuit board 112 by arranging wires. The light source 13 is configured to emit laser light, and the laser light may be infrared light. In one example, the light source 13 may include a semiconductor substrate and an emitting laser disposed on the semiconductor substrate. The semiconductor substrate is disposed on the substrate 111, and the emitting laser may be a vertical cavity surface emitting laser (VCSEL). The semiconductor substrate may be provided with a single emitting laser or an array laser composed of a plurality of emitting lasers. In detail, the plurality of the emitting lasers may be arranged on the semiconductor substrate in a regular or irregular two-dimensional pattern.

The collimating element 14 can be an optical lens, the collimating element 14 is configured to collimate the laser light emitted by the light source 13, the collimating element 14 is received in the receiving cavity 121, and the collimating element 14 can be assembled into the receiving cavity 121 in a direction along the second surface 125 towards the first surface 124. In detail, the collimating element 14 includes a bonding surface 143. When the bonding surface 143 is combined with the second limiting surface 1233, the collimating element 14 is considered to be installed in place.

The collimating element 14 includes an optical portion 141 and a mounting portion 142. The mounting portion 142 is configured to be combined with the side wall 122 of the lens barrel to fix the collimating element 14 in the receiving cavity 121. In embodiments of the present disclosure, the bonding surface 143 is an end surface of the mounting portion 142, and the optical portion 141 includes two curved surfaces on opposite sides of the collimating member 14. One of the curved surfaces of the collimating element 14 extends into the light passing hole 1231.

The diffractive optical element 15 is mounted on the limiting protrusion 123. In detail, the diffractive optical element 15 includes a mounting surface 151, and the mounting surface 151 is combined with the first limiting surface 1232 to mount the diffractive optical element 15 on the limiting protrusion 123. A certain area on the mounting surface 151 may be formed with a diffractive structure, and the diffractive structure may correspond to the position of the light passing hole 1231 and diffract the laser light collimated by the collimating element 14 into a laser pattern corresponding to the diffractive structure, and other areas on the mounting surface 151 may be planar and combined with the first limiting surface 1232. The diffractive optical element 15 can be made of glass or composite plastics such as PET.

As illustrated in FIG. 2, in some embodiments, the laser projection component 10 further includes a protective cover 16 disposed on the first surface 124. The side of the diffractive optical element 15 opposite to the mounting surface 151 is in contact with the protective cover 16. After the diffractive optical element 15 is mounted on the limiting protrusion 123, the protective cover 16 is mounted to prevent the diffractive optical element 15 from falling off. The protective cover 16 may be made of a light transmitting material such as glass, polymethyl methacrylate (PMMA), polycarbonate (PC), polyimide (PI), or the like. Since the light transmitting material such as glass, PMMA, PC, and PI has excellent light transmitting property, it is unnecessary for the protective cover 16 to be provided with a light passing hole. In this manner, the protective cover 16 can prevent the diffractive optical element 15 from being exposed to the outside of the lens barrel 12 while preventing the diffractive optical element 15 from falling off, thereby achieving waterproof and dustproof of the diffractive optical element 15. In other embodiments, the protective cover 16 may be provided with a light passing hole opposite to an optical effective area of the diffractive optical element 15 to avoid blocking the light path of the diffractive optical element 15.

Figure 3:
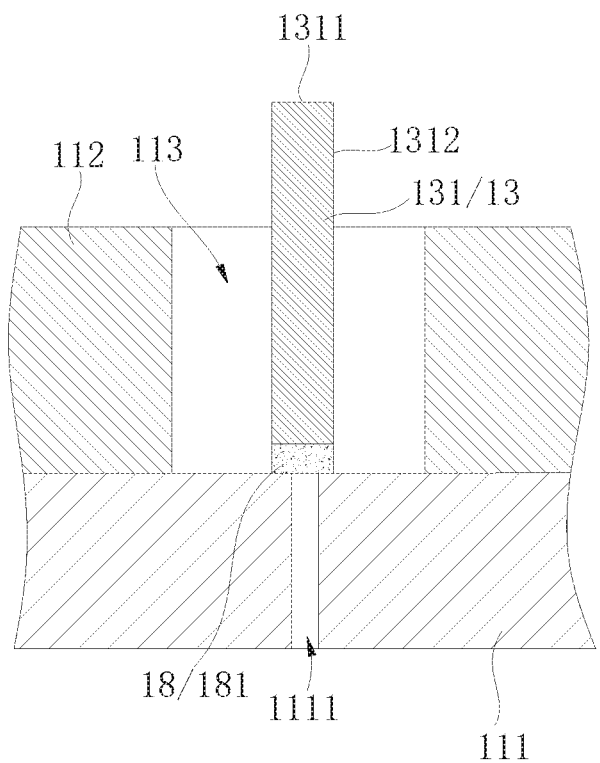

As illustrated in FIGS. 2 and 3, in some embodiments, the light source 13 includes an edge-emitting laser (EEL) 131. In detail, the edge-emitting laser 131 may be a distributed feedback laser (DFB). The edge-emitting laser 131 is columnar as a whole, and an end surface of the edge-emitting laser 131 away from the substrate assembly 11 is formed with a light emitting surface 1311. The laser light is emitted from the light emitting surface 1311, and the light emitting surface 1311 faces to the collimating element 14. When the edge-emitting laser 131 is used as the light source, in one hand, a temperature drift of the edge-emitting laser 131 is smaller than that of a VCSEL array, and in other hand, since the edge-emitting laser 131 is a single-point illumination structure, it is unnecessary to design an array structure, such that the manufacture of the edge-emitting laser is sample and the cost of the light source of the laser projection component 10 is low.

Figure 4:
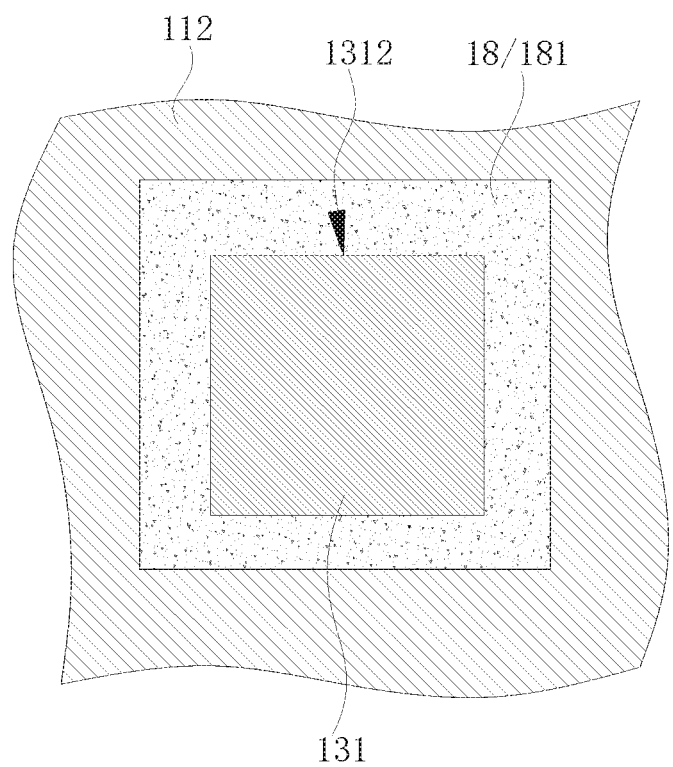

As illustrated in FIGS. 3 and 4, in some embodiments, the laser projection component 10 further includes a fixing member 18 for fixing the edge-emitting laser 131 on the substrate assembly 11. When the laser light of the distributed feedback laser propagates, a gain of power is obtained through feedback of a grating structure. To increase the power of the distributed feedback laser, it is required to increase an injecting current and/or increase a length of the distributed feedback laser. Since increasing the injecting current will increase a power consumption of the distributed feedback laser and cause serious heat generation, in order to ensure a normal operation of the distributed feedback laser, it is required to increase the length of the distributed feedback laser, thus the distributed feedback laser is usually in an elongate strip shape. When the light emitting surface 1311 of the edge-emitting laser 131 faces to the collimating element 14, the edge-emitting laser 131 is placed vertically, and since the edge-emitting laser 131 is in an elongated strip shape, the edge-emitting laser 131 is prone to accidents such as dropping, shifting or shaking, therefore the fixing member 18 is provided for fixing the edge-emitting laser 131 so as to avoid the accidents.

In detail, as illustrated in FIG. 3, in some embodiments, the fixing member 18 includes a sealant 181 disposed between the edge-emitting laser 131 and the substrate assembly 11. In more detail, in an example illustrated in FIG. 3, the surface of the edge-emitting laser 131 opposite to the light emitting surface 1311 is attached to the substrate assembly 11. In an example illustrated in FIG. 4, the side surfaces 1312 of the edge-emitting laser 131 may also be attached to the substrate assembly 11. The sealant 181 encloses the side surfaces 1312, or may be used to attach one surface of the side surfaces 1312 to the substrate assembly 11 or attach a plurality of surfaces of the side surfaces 1312 to the substrate assembly 11. Further, the sealant 181 may be a thermal conductive adhesive to conduct heat generated during operation of the light source 13 to the substrate assembly 11. In order to improve the heat dissipation efficiency, a heat dissipation hole 1111 may be further provided on the substrate 111. The heat generated during operations of the light source 13 or the circuit board 112 may be dissipated by the heat dissipation hole 1111, and the heat dissipation hole 1111 may be filled with the thermal conductive adhesive to further improve the heat dissipation performance of the substrate assembly 11.

Figure 5:
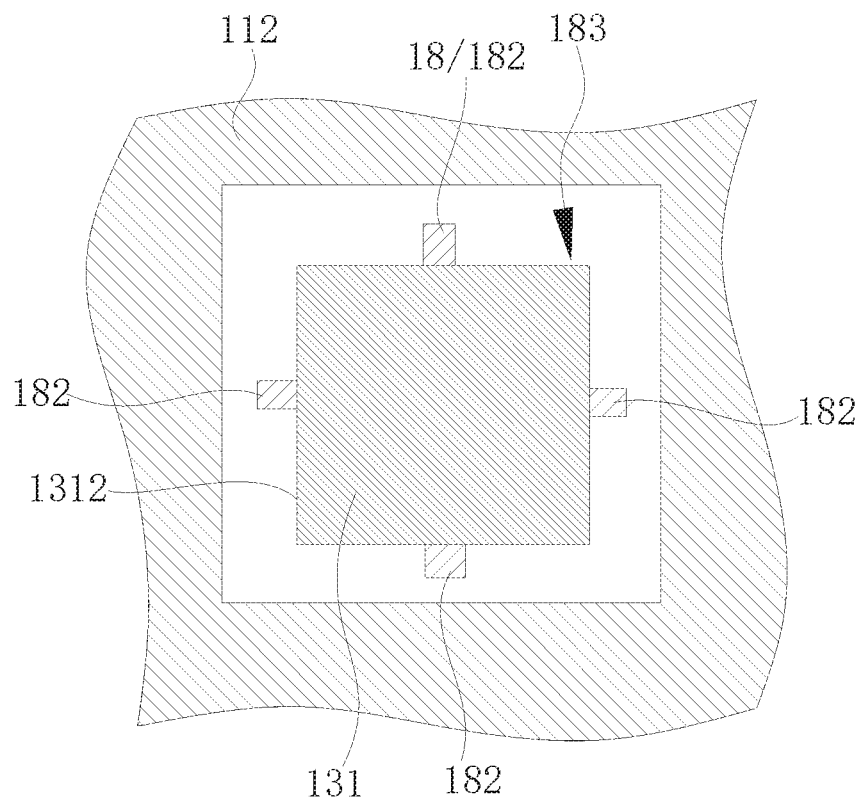

As illustrated in FIG. 5, in some embodiments, the fixing member 18 includes at least two elastic supporting frames 182 disposed on the substrate assembly 11, and the at least two supporting frames 182 collectively form a receiving space 183 for receiving the edge-emitting laser 131. The at least two supporting frames 182 are configured for supporting the edge-emitting laser 131 to further prevent the edge-emitting laser 131 from shaking.

In some embodiments, the substrate 111 can be omitted and the light source 13 can be directly fixed to the circuit board 112 to reduce the overall thickness of the laser projector 10.

Figure 6:
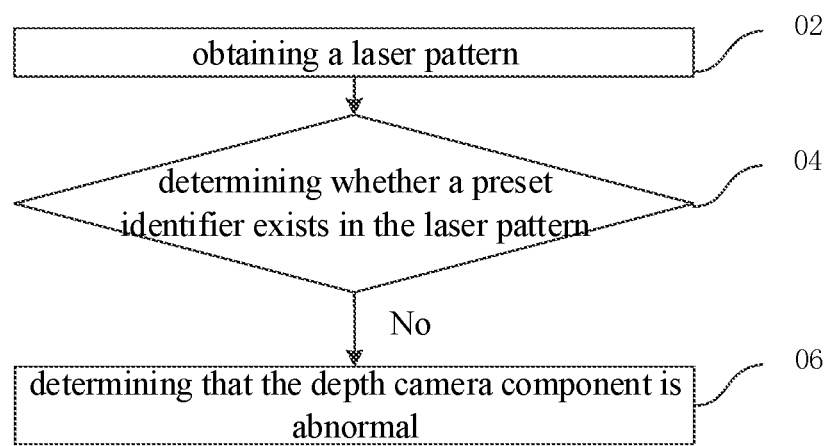
FIG. 6 is a schematic flow chart of a detection method of a laser projection component according to an embodiment of the present disclosure.

As illustrated in FIGS. 1, 2 and 6, a detection method of the laser projection component 10 can be used in the laser projection component 10, and the laser projection component 10 can be a laser projection component 10 according to any of the above embodiments or a laser projection component existing in the prior art. The laser projection component 10 can be used for a depth camera component 100, and the detection method includes followings.

At block 02, a laser pattern is obtained.

At block 04, it is determined whether a preset identifier exists in the laser pattern.

At block 06, it is determined that the depth camera component 100 is abnormal when the preset identifier does not exist in the laser pattern.

An optical system (e.g. the collimating element, the diffractive optical element) is usually composed of glass parts or other fragile parts. In the event of a fall, the optical system may be broken or other abnormal conditions may occur, and the laser light will be directly emitted to illuminate the user's body or eyes, which causes serious safety hazards. How to determine an abnormality of the depth camera component is a desiderated problem to be solved in the art. The detection method of the laser projection component 10 and the laser projection component 10 according to embodiments of the present disclosure determine whether the depth camera component 100 is abnormal by determining whether a preset identifier exists in the laser pattern, and when the depth camera component 100 is abnormal, the laser projection component 10 is turned off or the transmit power of the laser projection component 10 is reduced, thereby preventing the laser light emitted by the laser projection component 10 from having too high energy to cause harm to the user's body or eyes and improving the use safety of the depth camera component 100.

In detail, the depth camera component 100 includes the laser projection component 10. After the laser light passes through the diffractive optical element 15, the laser pattern projected by the laser projection component 10 is formed. A shape of the laser pattern is determined by the diffraction structure of the diffractive optical element 15. When the diffractive optical element 15 is normal, the laser light passes through the normal diffractive structure such that the laser pattern has a predetermined shape, and the preset identifier exists in the laser pattern. The preset identifier may be a predetermined point, line, or pattern (e.g. circle, triangle) in the laser pattern. When the diffractive optical element 15 is abnormal (e.g. broken, tilted, fall off), the diffractive structure may change, thus causing a change of the laser pattern, and the preset identifier may disappear. Therefore, it can be determined whether the preset identifier exists in the laser pattern, when the preset identifier exists in the laser pattern, the diffractive optical element 15 is normal; when the preset identifier does not exist in the laser pattern, the diffractive optical element 15 is abnormal. When the diffractive optical element 15 is abnormal, the laser projection component 10 is abnormal and the depth imaging component 100 is abnormal.

In some embodiments, the laser pattern may be deformed after being modulated by an object, while the preset identifier may still be recognized when the preset identifier exists in the laser pattern.

In some embodiments, the laser projection component 10 can project the laser light onto a plane, such that the obtained laser pattern is substantially undeformed, thereby facilitating subsequent determination on whether the preset identifier exists.

Figure 7:
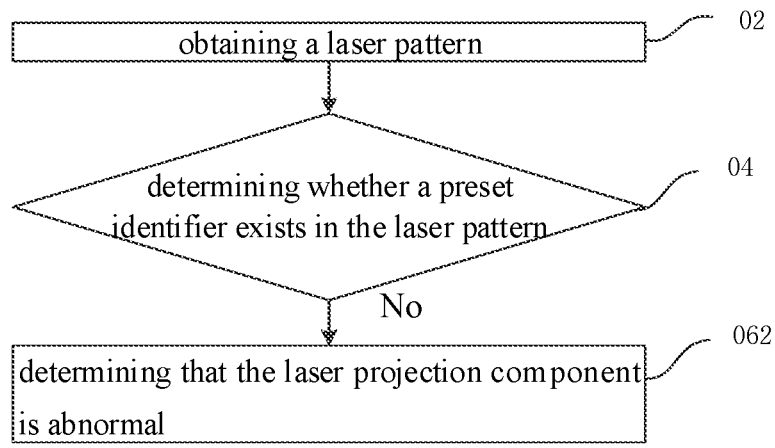
FIGS. 7 to 10 are schematic flow charts of a detection method of a laser projection component according to embodiments of the present disclosure.

As illustrated in FIG. 7, in some embodiments, the abnormality of the depth camera component 100 mainly refers to the abnormality of the laser projection component 10, and the abnormality of the laser projection component 10 mainly refers to the abnormality of the diffractive optical element 15. The act at block 06 includes followings.

At block 062, it is determined that the laser projection component 10 is abnormal (the diffractive optical element 15 is abnormal) when the preset identifier does not exist in the laser pattern.

In some embodiments, it is determined that the diffractive optical element 15 is normal when the preset identifier exists in the laser pattern and the act at block 02 is executed again.

Figure 8:
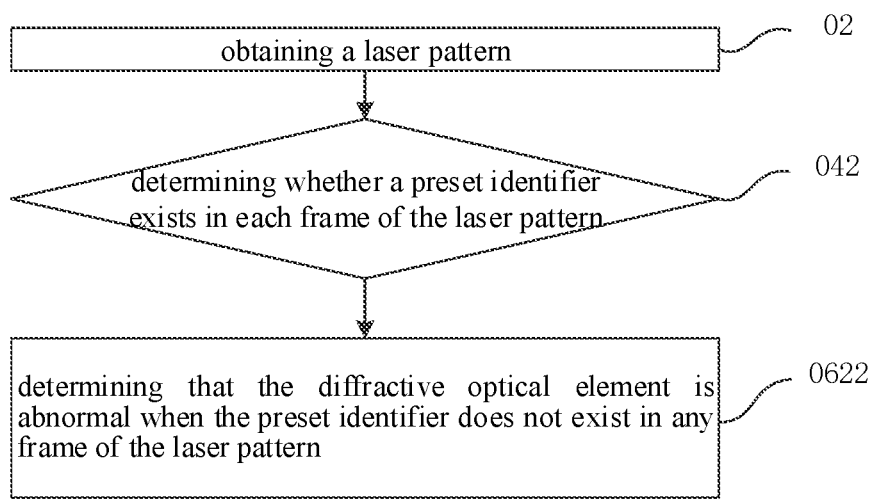

As illustrated in FIG. 8, in some embodiments, the act at block 04 includes followings.

At block 042, it is determined whether the preset identifier exists in each frame of the laser pattern.

The act at block 062 includes followings.

At block 0622, it is determined that the diffractive optical element 15 is abnormal when the preset identifier does not exist in any frame of the laser pattern.

By determining whether the a preset identifier exists in each frame of the laser pattern, it is possible to detect whether the diffractive optical element 15 is abnormal in real time, thereby turning off the laser projection component 10 or reducing the transmit power of the laser projection component 10 in real time, and further improving the use safety of the laser projection component 10.

It is determined that the diffractive optical element 15 is abnormal when the preset identifier does not exist in any frame of the laser pattern, thus, whether the diffractive optical element 15 is abnormal can be quickly determined, and the use safety of the laser projection component 10 is further improved.

In some embodiments, the diffractive optical element 15 is determined to be abnormal when there is no preset identifier in a preset number of consecutive frames of the laser pattern. In this way, erroneous judgment of whether the diffractive optical element 15 is abnormal can be reduced or avoided.

In detail, the preset number may be stored in the laser projection component 10 or set by the user. The preset number is, for example, 3 frames, 5 frames, 10 frames, which is not limited herein. For example, when the preset number is 3 frames, the diffractive optical element 15 is determined to be abnormal only if there is no preset identifier in three continuous frames of the laser pattern. When there is no preset identifier in two of the three consecutive frames of laser pattern and the remaining one frame of the laser pattern has a preset identifier, it is determined that the diffractive optical element 15 is normal.

Figure 9:
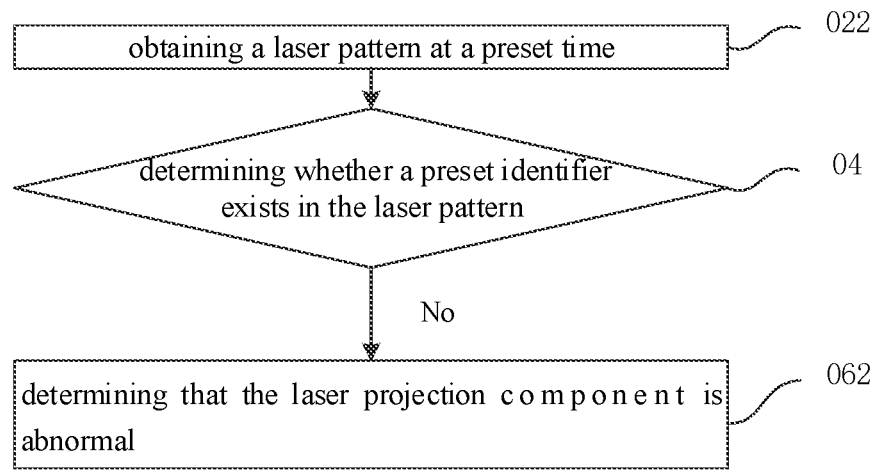

As illustrated in FIG. 9, in some embodiments, the act at block 02 includes followings.

At block 022, a laser pattern is obtained at a preset time.

The act at block 06 includes followings.

At block 062, it is determined that the laser projection component 10 is abnormal when the preset identifier does not exist in the laser pattern.

An optical system (e.g. the collimating element, the diffractive optical element) is usually composed of glass parts or other fragile parts. In the event of a fall, the optical system may be broken or other abnormal conditions may occur, the laser light will be directly emitted to illuminate the user's body or eyes, which causes serious safety hazards. How to determine the abnormality of the depth camera component is a desiderated problem to be solved in the art. The detection method of the laser projection component 10 and the laser projection component 10 according to embodiments of the present disclosure determine whether the diffractive optical element 15 is abnormal by determining whether the preset identifier exists in the laser pattern, and when the diffractive optical element 15 is abnormal, the laser projection component 10 is turned off or the transmit power of the laser projection component 10 is reduced, thereby preventing the laser light emitted by the laser projection component 10 from having too high energy to cause harm to the user's body or eyes and improving the use safety of the laser projection component 10. In addition, the laser pattern is obtained only at a preset time to determine whether the laser projection component 10 is abnormal, such that the workload required to determine whether the laser projection component 10 is abnormal can be reduced, thereby reducing the power consumption of the laser projection component 10.

Figure 10:
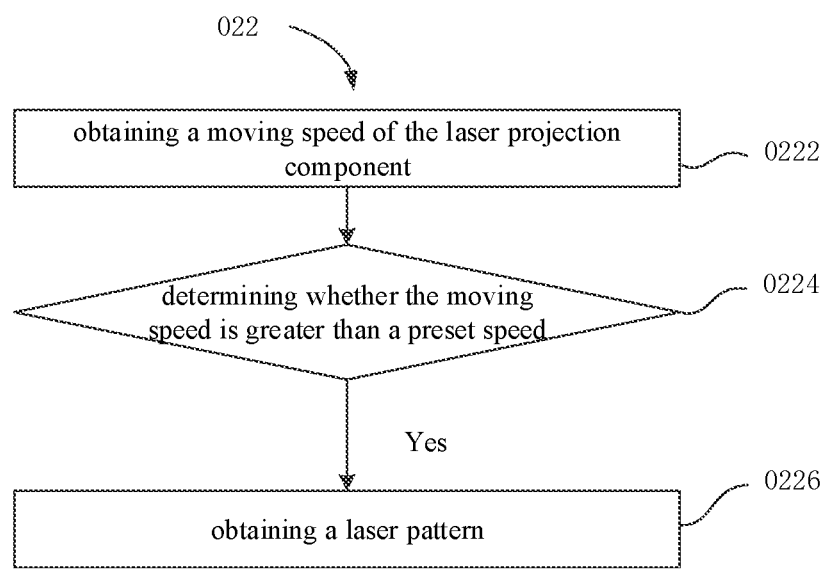

As illustrated in FIG. 10, in some embodiments, the act at block 022 includes followings.

At block 0222, a moving speed of the laser projection component 10 is obtained.

At block 0224, it is determined whether the moving speed is greater than a preset speed.

At block 0226, a laser pattern is obtained when the moving speed is greater than the preset speed.

In detail, a speed sensor may be used to detect the moving speed of the laser projection component 10. The speed sensor may be installed in the laser projection component 10 or may be installed in the depth camera component 100 together with the laser projection component 10 or in the electronic device 1000, the speed sensor detects a moving speed of the depth camera component 100 or the electronic device 1000, and further obtains the moving speed of the laser projection component 10. A large moving speed of the laser projection component 10 (e.g. greater than the preset speed) indicates that the laser projection component 10 may be falling down. At this time, the laser pattern can be obtained to determine whether a preset identifier exists in the laser pattern and the laser projection component 10 is determined to be abnormal when the preset identifier does not exist in the laser pattern. In this way, it is unnecessary to obtain the laser pattern and determine whether the preset identifier exists in the laser pattern in real time, such that the power consumption of the laser projection component 10 can be reduced.

The preset speed may be stored in the laser projection component 10, the depth camera component 100 or the electronic device 1000, or may be set by a user, which is not limited herein.

Figure 11:
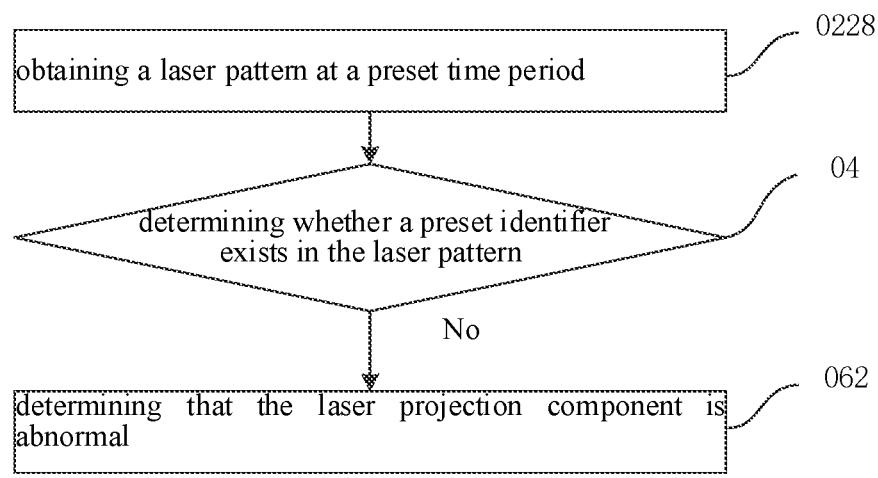
FIG. 11 is a schematic flow chart of a detection method of a laser projection component according to an embodiment of the present disclosure.

As illustrated in FIG. 11, in some embodiments, the act at block 022 includes followings.

At block 0228, a laser pattern is obtained at a preset time period.

In detail, when the laser projection component 10 is turned on, the laser pattern is obtained at a preset time period, for example, obtaining a frame of the laser pattern in every half hour and determine whether a preset identifier exists in the laser pattern. The power consumption of the laser projection component 10 of this embodiment is greatly reduced compared to obtaining the laser pattern per frame, and meanwhile, whether the laser projection component 10 is abnormal can be determined timely and accurately.

The preset time period may be stored in advance in the laser projection component 10, the depth camera component 100 or the electronic device 1000, or set by a user.

In some embodiments, the laser pattern can also be obtained only when the laser projection component 10 is triggered. When the laser projection component 10 is triggered, it indicates that the laser projection component 10 starts to operate, and whether the diffractive optical element 15 is abnormal can be determined according to a first frame of the laser pattern after the operation. When the diffractive optical element 15 is abnormal, a countermeasure can be taken timely, for example, turning off the laser projection component 10 or reducing the transmit power of the laser projection component 10.

Figure 12:
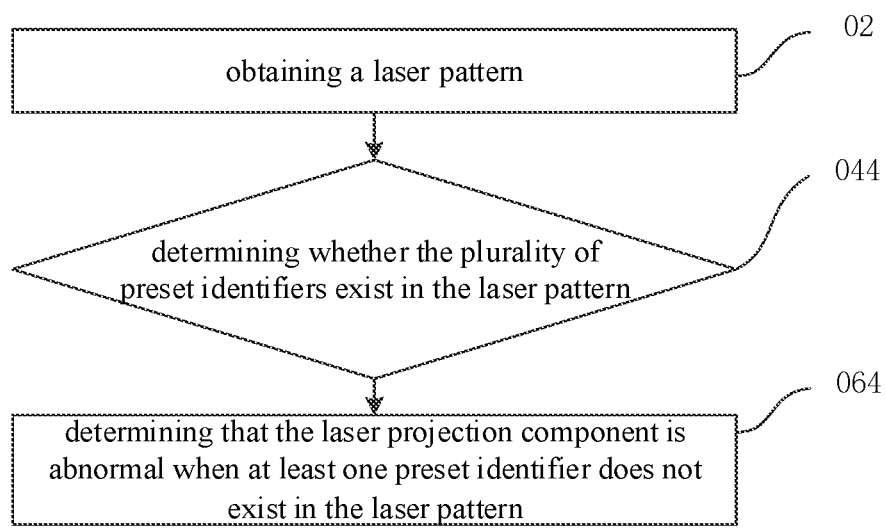
FIGS. 12 and 13 are schematic flow charts of a detection method of a laser projection component according to embodiments of the present disclosure.

As illustrated in FIG. 12, in some embodiments, there may be a plurality of preset identifiers, and the act at block 04 includes followings.

At block 044, it is determined whether the plurality of preset identifiers exist in the laser pattern.

The act at block 06 includes followings.

At block 064, it is determined that the laser projection component 10 is abnormal (the diffractive optical element 15 is abnormal) when at least one preset identifier does not exist in the laser pattern.

The plurality of the preset identifiers may be distrusted at a plurality of positions in the laser pattern, so that a plurality of regions of the diffractive optical element 15 can be detected, and whether the diffractive optical element 15 is abnormal can be more comprehensively determined, thereby improving the accuracy of determining whether the diffractive optical element 15 is abnormal.

In detail, there are a plurality of preset identifiers, and it can be understood that the number of the preset identifiers is two or more. In an example, the number of the preset identifiers is four.

Determining that the laser projection component 10 is abnormal when at least one preset identifier does not exist in the laser pattern can be understood that determining that the laser projection component 10 is abnormal when a preset identifier does not exist in the laser pattern, or that the laser projection component 10 is abnormal when the plurality of preset identifiers do not exist in the laser pattern. In an embodiment, the number of the preset identifiers is four, if no preset identifier is detected in the laser pattern, i.e., all the four preset identifiers do not exist, the diffractive optical element 15 can be determined to be abnormal. In another embodiment, the number of the preset identifiers is four, if three preset identifiers are detected in the laser pattern, i.e., one preset identifier does not exist, the diffractive optical element 15 may also be determined to be abnormal. In a still embodiment, the number of the preset identifiers is four, if four preset identifiers are detected in the laser pattern, i.e., all the preset identifiers exist, the diffractive optical element 15 can be determined to be normal.

Figure 13:
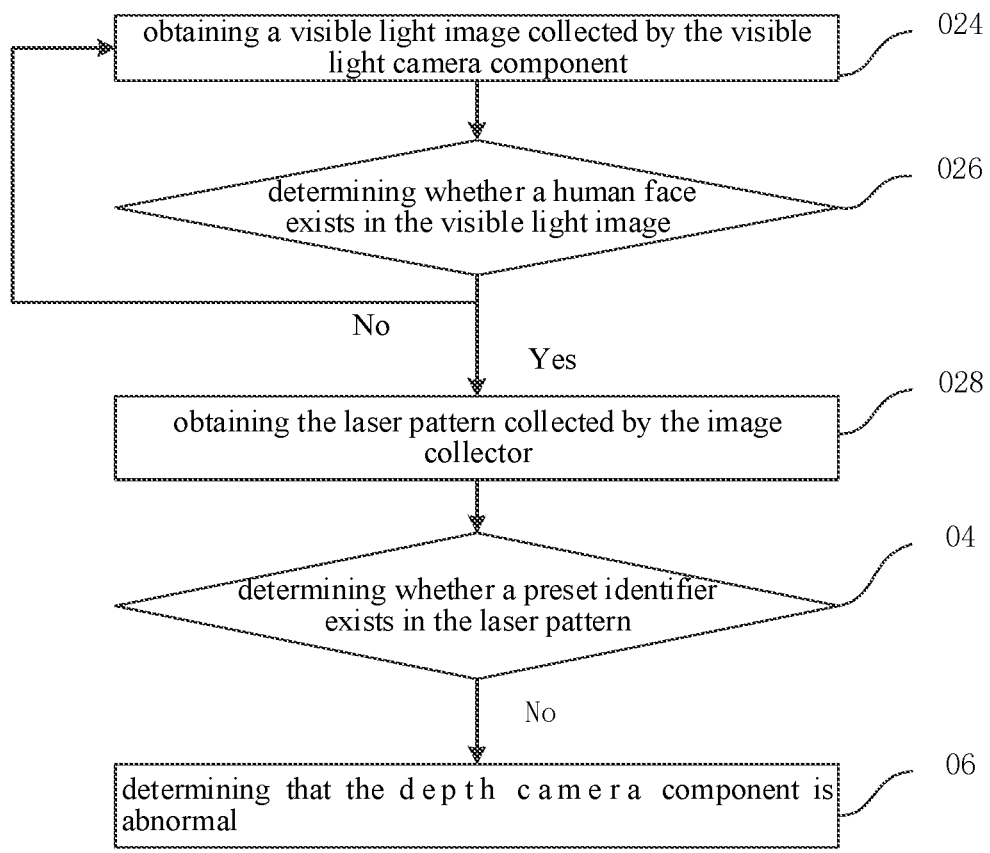

As illustrated in FIG. 13, in some embodiments, the detection method of the laser projection component 10 can be applied to the electronic device 1000 according to any of the above embodiments. The act at block 02 includes followings.

At block 024, a visible light image collected by the visible light camera component 400 is obtained.

At block 026, it is determined whether a human face exists in the visible light image.

At block 028, a laser pattern collected by the image collector 20 is obtained when the human face exists in the visible light image.

An optical system (e.g. the collimating element, the diffractive optical element) is usually composed of glass parts or other fragile parts. In the event of a fall, the optical system may be broken or other abnormal conditions may occur, the laser light will be directly emitted to illuminate the user's body or eyes, thus causing serious safety hazards. How to determine the abnormality of the depth camera component is a desiderated problem to be solved in the art. The detection method of the laser projection component 10 and the electronic device 1000 according to embodiments of the present disclosure can determine whether the depth camera component 100 is abnormal when a human face exists in the visible light image, and when the depth camera component 100 is abnormal, the laser projection component 10 is turned off or the transmit power of the laser projection component 10 is reduced, thereby preventing the laser light emitted by the laser projection component 10 from having too high energy to cause harm to the user's body or eyes and improving the use safety of the laser projection component 10.

In detail, since the visible light image has sufficient two-dimensional information, the visible light image can be used to quickly and accurately determine the content in a scene. For example, it can be first determined whether a human face exists in the visible light image, if yes and the depth camera component 100 is used, the laser light is easy to cause danger to the human body. Therefore, it is required to determine whether the depth camera component 100 is abnormal by determining whether a preset identifier exists in the laser pattern, when the depth camera component 100 is abnormal, the depth camera component 100 can be turned off, or the transmit power of the laser projection component 10 can be reduced.

When the depth camera component 100 is abnormal (the laser projection component 10 is abnormal and/or the image collector 20 is abnormal), the laser pattern generally changes correspondingly, so that the preset identifier may disappear. The preset identifier may be a predetermined point, line, or pattern (e.g. circle, triangle) in the laser pattern. Therefore, it can be determined whether a preset identifier exists in the laser pattern, when a preset identifier exists in the laser pattern, the depth camera component 100 is normal; when no preset identifier exists in the laser pattern, the depth camera component 100 is abnormal.

In some embodiments, the laser pattern may be deformed after being modulated by the object, while the preset identifier may still be recognized when there is a preset identifier in the laser pattern.

In some embodiments, the laser projection component 10 can project the laser light onto the plane, such that the obtained laser pattern is substantially undeformed, thereby facilitating subsequent determination of whether the preset identifier exists.

In some embodiments, when there is no human face in the visible light image, the depth camera component 100 generally does not endanger the human body, so the act at block 024 can be executed again without executing the act at block 028.

In some embodiments, when the preset identifier exists in the laser pattern, it can be determined that the depth camera component 100 is normal, and the depth camera component 100 can work normally.

In some embodiments, the visible light image collected by the visible light camera component 400 can be obtained at a preset time period. In detail, the visible light image is obtained at a preset time period, for example, a frame of a visible light image is obtained every half hour to determine whether a human face exists in the visible light image, and the power consumption of the electronic device 1000 of the present embodiment is greatly reduced compared to obtaining the visible light image per frame, meanwhile, it is possible to timely and accurately determine whether the human face exists in the visible light image. The preset time period may be stored in the electronic device 1000 in advance or set by a user.

Figure 14:
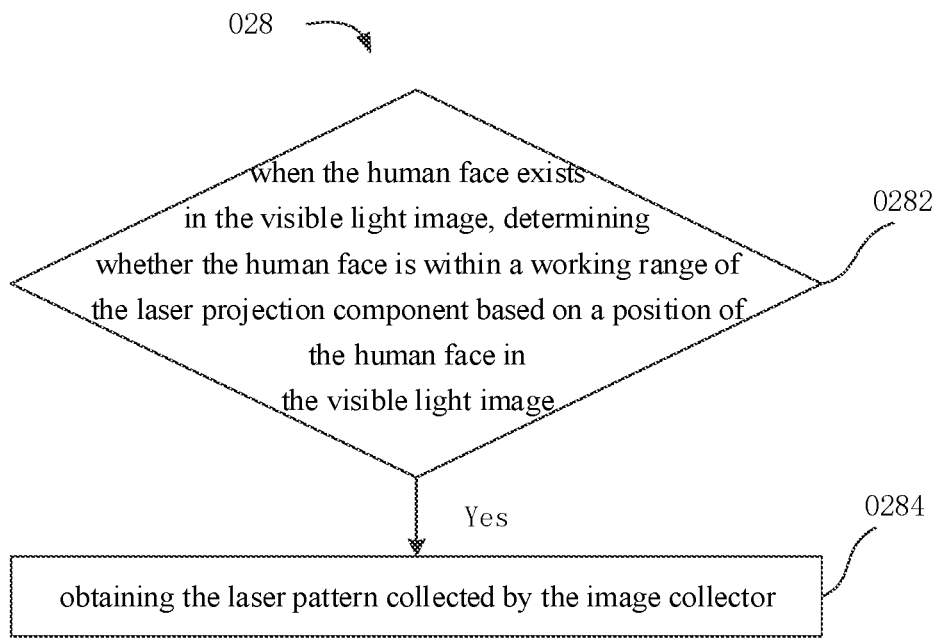
FIG. 14 is a schematic flow chart of a detection method of a laser projection component according to an embodiment of the present disclosure.

As illustrated in FIG. 14, in some embodiments, the act at block 028 includes followings.

At block 0282, when a human face exists in the visible light image, it is determined whether the human face is within a working range of the laser projection component 10 based on a position of the human face in the visible light image.

At block 0284, a laser pattern collected by the image collector 20 is obtained when the human face is within the working range of the laser projection component 10.

When the human face is within the working range of the laser projection component 10 and the depth camera component 100 is abnormal, the laser light projected by the laser projection component 10 will cause great danger to the human face, so it can be determined whether the human face is within the working range of the laser projection component 10, and when the human face is within the working range of the laser projection component 10, it can be determined whether the depth camera component 100 is abnormal.

In detail, when a human face exists in the visible light image, the position of the human face in the visible light image can be obtained, and in combination with the field of view of the visible light camera component 400, the working range of the laser projection component 10, the relative position of the laser projection component 10 and the visible light camera component 400, it can be determined whether the human face is within the working range of the laser projection component 10. In an embodiment, the visible light camera component 400 and the laser projection component 10 are disposed adjacent to each other, and the field of view of the visible light camera component 400 and the working range of the laser projection component 10 are substantially overlapped, such that when a human face exists in the visible light image, the human face is within the working range of the laser projection component 10.

Figure 15:
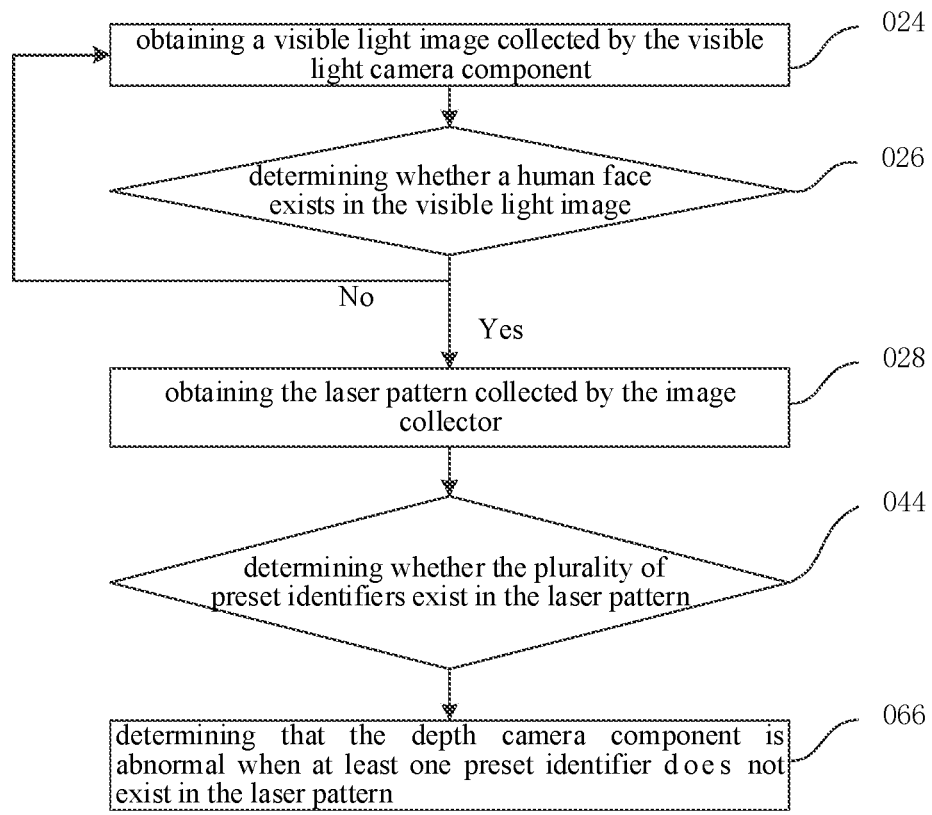
FIGS. 15 and 16 are schematic flow charts of a detection method of a laser projection component according to embodiments of the present disclosure.

As illustrated in FIG. 15, in some embodiments, there are a plurality of preset identifiers, and the act at block 04 includes followings.

At block 044, it is determined whether the plurality of preset identifiers exist in the laser pattern.

The act at block 06 includes followings.

At block 066, it is determined that the depth camera component 100 is abnormal when at least one preset identifier does not exist in the laser pattern.

The plurality of the preset identifiers may be distributed at a plurality of positions in the laser pattern, so that whether the depth camera component 100 is abnormal can be more comprehensively determined, thereby improving the accuracy of determining whether the depth camera component 100 is abnormal.

In detail, there are a plurality of preset identifiers, and it can be understood that the number of the preset identifiers is two or more. In an example, the number of the preset identifiers is four.

Determining that the depth camera component 100 is abnormal when at least one preset identifier does not exist in the laser pattern, can be understood that determining that the depth camera component 100 is abnormal when one preset identifier does not exist in the laser pattern, or that the depth camera component 100 is abnormal when the plurality of preset identifiers do not exist in the laser pattern. In an embodiment, the number of the preset identifiers is four, if no preset identifier is detected in the laser pattern, i.e., all the four preset identifiers do not exist, the depth camera component 100 can be determined to be abnormal. In another embodiment, the number of the preset identifiers is four, if three preset identifiers are detected in the laser pattern, i.e., one preset identifier does not exist, the depth camera component 100 may also be determined to be abnormal. In a still embodiment, the number of the preset identifiers is four, if four preset identifiers are detected in the laser pattern, i.e., all the preset identifiers exist, the depth camera component 100 can be determined to be normal.

Figure 16:
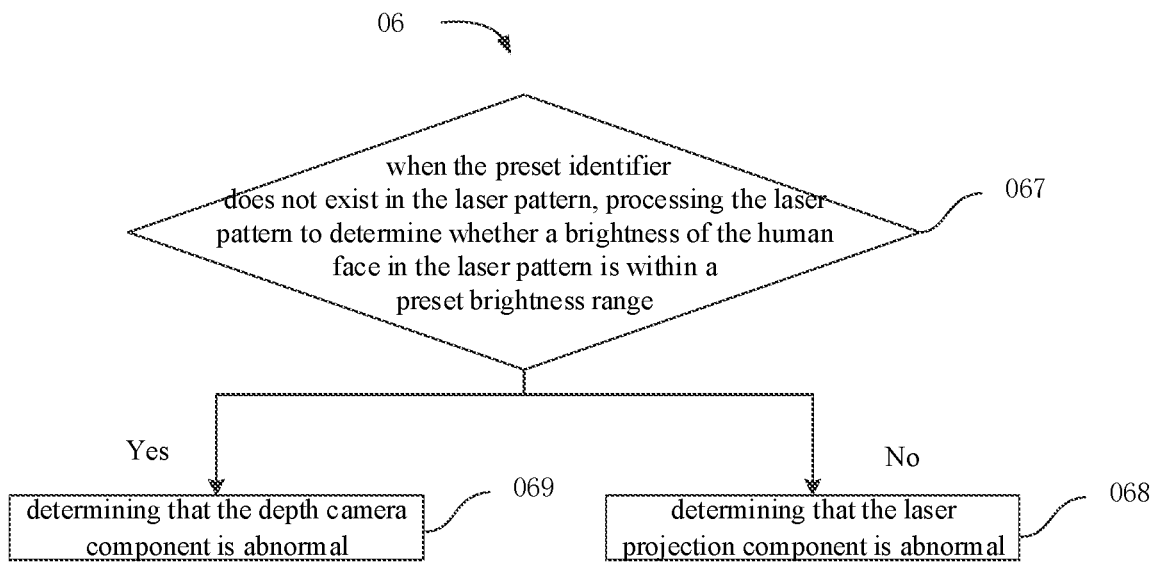

As illustrated in FIG. 16, in some embodiments, the act at block 06 includes followings.

At block 067, where the preset identifier does not exist in the laser pattern, the laser pattern is processed to determine whether a brightness of the human face in the laser pattern is within a preset brightness range.

At block 068, it is determined that the laser projection component 10 is abnormal when the brightness of the human face is beyond the preset brightness range.

Whether the abnormality of the depth camera component 100 is the abnormality of the laser projection component 10 can be accurately determined by determining whether the brightness of the human face in the laser pattern is within the preset brightness range.

In detail, the laser pattern projected by the laser projection component 10 is formed after the laser light passes through the collimating element 14 and the diffractive optical element 15. When both the collimating element 14 and the diffractive optical element 15 are working normally, the laser light passes through them normally so that the brightness of the human face in the laser pattern is within the preset brightness range. If the collimating element 14 and/or the diffractive optical element 15 are abnormal (e.g. broken, tilted, detached), the laser light propagates abnormally (e.g. abnormal divergence or convergence), such that the brightness of the human face in the laser pattern is beyond the preset brightness range. The brightness of the human face may be an average brightness of a face area, or a highest or lowest brightness of the face area, or a difference between the highest brightness and the lowest brightness of the face area, which is not limited herein. The preset brightness range may be stored in the electronic device 1000 in advance or set by a user. When the collimating element 14 and/or the diffractive optical element 15 are abnormal, the laser projection component 10 is abnormal, and the depth camera component 100 is abnormal.

In some embodiments, the user may be prompted that the laser projection component 10 is abnormal when the brightness of the human face is beyond the preset brightness range.

As illustrated in FIG. 16, in some embodiments, the act at block 06 includes followings.

At block 069, it is determined that the depth camera component 100 is abnormal when the brightness of the human face is within a preset brightness range.

If the preset identifier does not exist in the laser pattern and the brightness of the human face in the laser pattern is within the preset brightness range, the depth camera component 100 is determined to be abnormal, but whether the laser projection component 10 is abnormal (or the image collector 20 is abnormal) cannot be determined.

In some embodiments, the user may be prompted that the depth camera component 100 is abnormal when the brightness of the human face is within the preset brightness range. Compared to being within the preset brightness range, when the brightness of the human face is beyond the preset brightness range, the depth camera component 100 is more likely to cause damage to the human body and the damage is more serious. Therefore, a priority of a fault prompt when the brightness of the human face is beyond the preset brightness range may be higher than that of a fault prompt when the brightness of the human face is within the preset brightness range, so that it is easier to detect the abnormality when the brightness of the human face of the user is beyond the preset brightness range.

Embodiments of the present disclosure further provide a detection device of the laser projection component.

Figure 17:
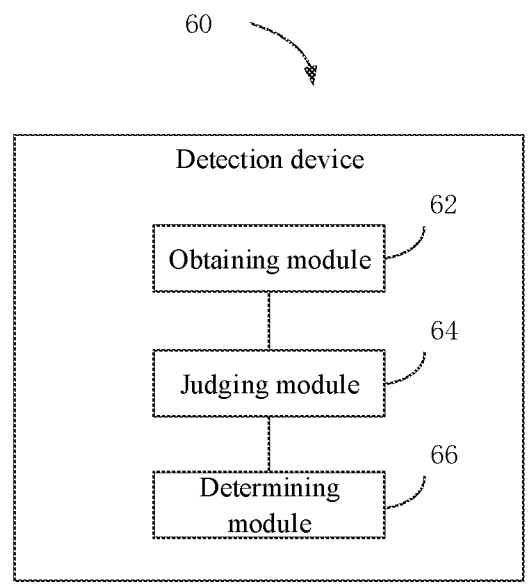
FIG. 17 is a schematic diagram of a detection device of a laser projection component according to an embodiment of the present disclosure.

As illustrated in FIGS. 1, 2 and 17, the detection device 60 of the laser projection component 10 can be used for the laser projection component 10, and the laser projection component 10 can be a laser projection component 10 according to any of the above embodiments or a laser projection component existing in the prior art. The laser projection component 10 can be used for a depth camera component 100. The detection device 60 includes an obtaining module 62, a judging module 64 and a determining module 66. The obtaining module 62 is configured to obtain a laser pattern. The judging module 64 is configured to determine whether a preset identifier exists in the laser pattern. The determining module 66 is configured to determine that the depth camera component 100 is abnormal when the preset identifier does not exist in the laser pattern.

In other words, the detection method of the laser projection component 10 according to embodiments of the present disclosure can be implemented by the detection device 60 of the laser projection component 10 according to embodiments of the present disclosure. The act at block 02 can be implemented by the obtaining module 62, the act at block 04 can be implemented by the judging module 64, and the act at block 06 can be implemented by the determining module 66.

In some embodiments, the detection device 60 can be referred to as an application (APP).

Figure 18:
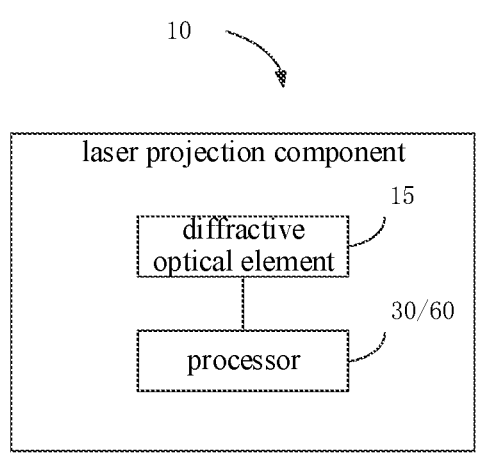
FIG. 18 is a schematic diagram of a laser projection component according to an embodiment of the present disclosure.

As illustrated in FIG. 18, in some embodiments, the detection device 60 may be referred to as a processor 30, and the processor 30 may be applied to a laser projection component 10 according to any one of the above embodiments or a laser projection component existing in the prior art, or the laser projection component 10 includes the processor 30. The processor 30 is configured to obtain a laser pattern, determine whether a preset identifier exists in the laser pattern, and determine that the depth camera component 100 is abnormal when the preset identifier does not exist in the laser pattern.

In other words, the detection method of the laser projection component 10 according to embodiments of the present disclosure can be implemented by the laser projection component 10 according to embodiments of the present disclosure. The acts at blocks 02, 04 and 06 can be implemented by the processor 30.

In some embodiments, the determining module 66 is further configured to determine that the laser projection component 10 is abnormal when the preset identifier does not exist in the laser pattern.

Further, the processor 30 is configured to determine that the laser projection component 10 is abnormal when the preset identifier does not exist in the laser pattern.

As illustrated in FIG. 17, in some embodiments, the judging module 64 is configured to determine whether the preset identifier exists in each frame of the laser pattern. The determining module 66 is configured to determine that the diffractive optical element 15 is abnormal when the preset identifier does not exist in any frame of the laser pattern.

As illustrated in FIG. 18, in some embodiments, the processor 30 is configured to determine whether the preset identifier exists in each frame of the laser pattern, and determine that the diffractive optical element 15 is abnormal when the preset identifier does not exist in any frame of the laser pattern.

That is, the act at block 042 can be implemented by the judging module 64 or the processor 30, the act at block 0622 can be implemented by the determining module 66 or the processor 30.

As illustrated in FIG. 17, in some embodiments, the obtaining module 62 is configured to obtain a laser pattern at a preset time. The determining module 66 is configured to determine that the laser projection component 10 is abnormal when the preset identifier does not exist in the laser pattern.

As illustrated in FIG. 18, in some embodiments, the processor 30 is configured to obtain a laser pattern at a preset time and determine that the laser projection component 10 is abnormal when the preset identifier does not exist in the laser pattern.

That is, the act at block 022 can be implemented by the obtaining module 62 or the processor 30, and the act at block 062 can be implemented by the determining module 66 or the processor 30.

As illustrated in FIG. 17, in some embodiments, the obtaining module 62 is configured to obtain a laser pattern at a preset time period.

As illustrated in FIG. 18, in some embodiments, processor 30 is configured to obtain a laser pattern at a preset time period.

That is, the act at block 0228 can be implemented by the obtaining module 62 or the processor 30.

Figure 19:
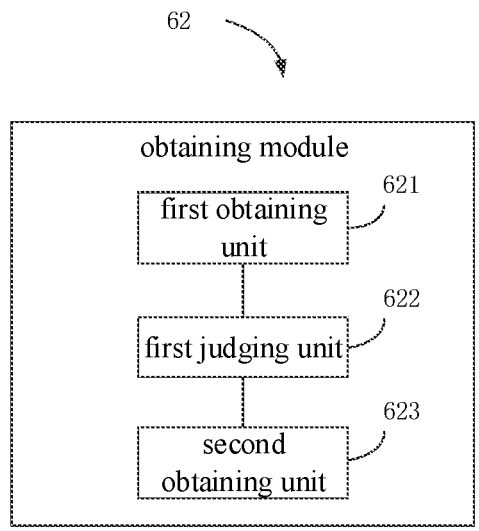
FIG. 19 is a schematic diagram of an obtaining module according to an embodiment of the present disclosure.

As illustrated in FIG. 19, in some embodiments, the obtaining module 62 includes a first obtaining unit 621, a first judging unit 622 and a second obtaining unit 623. The first obtaining unit 621 is configured to obtain a moving speed of the laser projection component 10. The first judging unit 622 is configured to determine whether the moving speed is greater than a preset speed. The second obtaining unit 623 is configured to obtain a laser pattern when the moving speed is greater than the preset speed.

As illustrated in FIG. 18, in some embodiments, the processor 30 is configured to obtain a moving speed of the laser projection component 10, determine whether the moving speed is greater than a preset speed, and obtain a laser pattern when the moving speed is greater than the preset speed.

That is, the act at block 0222 can be implemented by the first obtaining unit 621 or the processor 30, the act at block 0224 can be implemented by the judging unit 622 or the processor 30, and the act at block 0226 can be implemented by the second obtaining unit 623 or the processor 30.

As illustrated in FIG. 17, in some embodiments, there are a plurality of preset identifiers, and the judging module 64 is configured to determine whether the plurality of preset identifiers exist in the laser pattern; the determining module 66 is configured to determine that the laser projection component 10 is abnormal when at least one preset identifier does not exist in the laser pattern.

As illustrated in FIG. 18, in some embodiments, there are a plurality of preset identifiers, and the processor 30 is configured to determine whether the plurality of preset identifiers exist in the laser pattern, and determine that the laser projection component 10 is abnormal when at least one preset identifier does not exist in the laser pattern.

That is, the act at block 044 can be implemented by the judging module 64 or the processor 30, the act at block 064 can be implemented by the determining module 66 or the processor 30.

Figure 20:
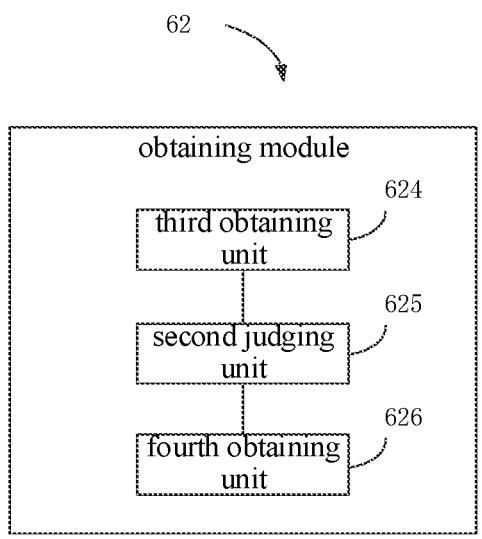
FIG. 20 is a schematic diagram of an obtaining module according to an embodiment of the present disclosure.

As illustrated in FIG. 20, in some embodiments, the detection device 60 of the laser projection component 10 can be used in the electronic device 1000 according to any of the above embodiments. The obtaining module 62 includes a third obtaining unit 624, a second judging unit 625, and a fourth obtaining unit 626. The third obtaining unit 624 is configured to obtain a visible light image collected by the visible light camera component 400. The second judging unit 625 is configured to determine whether a human face exists in the visible light image. The fourth obtaining unit 626 is configured to obtain a laser pattern collected by the image collector 20 when the human face exists in the visible light image.

Figure 21:
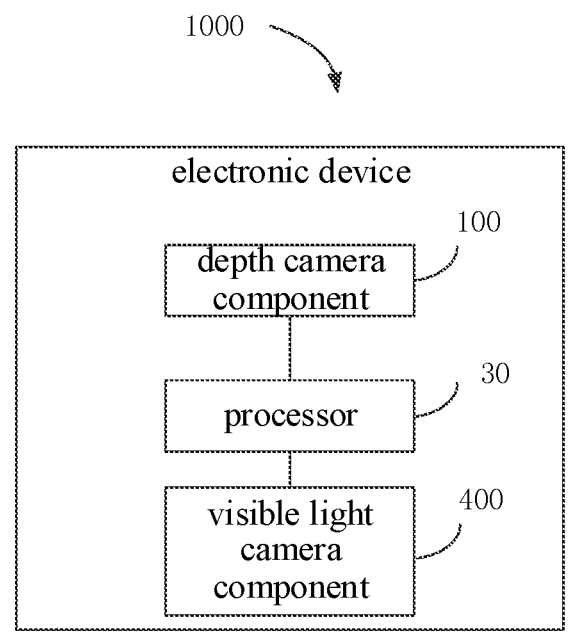
FIG. 21 is a schematic diagram of an electronic device according to an embodiment of the present disclosure.

As illustrated in FIG. 21, in some embodiments, the processor 30 is used for the electronic device 1000, in other words, the electronic device 1000 includes the processor 30. The processor 30 is configured to obtain a visible light image collected by the visible light camera component 400, determine whether a human face exists in the visible light image, and obtain a laser pattern collected by the image collector 20 when the human face exists in the visible light image.

That is, the act at block 024 can be implemented by the third obtaining unit 624 or the processor 30, the act at block 026 can be implemented by the second judging unit 625 or the processor 30, and the act at block 028 can be implemented by the fourth obtaining unit 626 or the processor 30.

Figure 22:
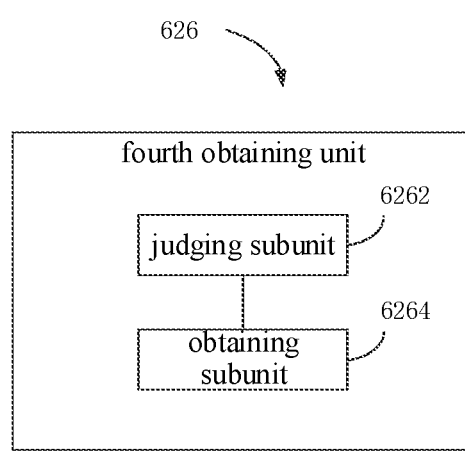
FIG. 22 is a schematic diagram of a fourth obtaining unit according to an embodiment of the present disclosure.

As illustrated in FIG. 22, in some embodiments, the fourth obtaining unit 626 includes a judging subunit 6262 and an obtaining subunit 6264. The judging subunit 6262 is configured to, when a human face exists in the visible light image, determine whether the human face is within a working range of the laser projection component 10 based on a position of the human face in the visible light image. The obtaining subunit 6264 is configured to obtain a laser pattern collected by the image collector 20 when the human face is within the working range of the laser projection component 10.

As illustrated in FIG. 21, in some embodiments, the processor 30 is configured to, when a human face exists in the visible light image, determine whether the human face is within a working range of the laser projection component 10 based on a position of the human face in the visible light image, and obtain a laser pattern collected by the image collector 20 when the human face is within the working range of the laser projection component 10.

That is, the act at block 052 can be implemented by the judging subunit 6262 or the processor 30, the act at block 054 can be implemented by the obtaining subunit 6264 or the processor 30.

As illustrated in FIG. 17, in some embodiments, there are a plurality of preset identifiers, the judging module 64 is configured to determine whether the plurality of preset identifiers exist in the laser pattern; the determining module 66 is configured to determine that the depth camera component 100 is abnormal when at least one preset identifier does not exist in the laser pattern.

As illustrated in FIG. 21, in some embodiments, there are a plurality of preset identifiers, and the processor 30 is configured to determine whether the plurality of preset identifiers exist in the laser pattern, and determine that the depth camera component 100 is abnormal when at least one preset identifier does not exist in the laser pattern.

That is, the act at block 044 can be implemented by the judging module 64 or the processor 30, the act at block 066 can be implemented by the determining module 66 or the processor 30.

Figure 23:
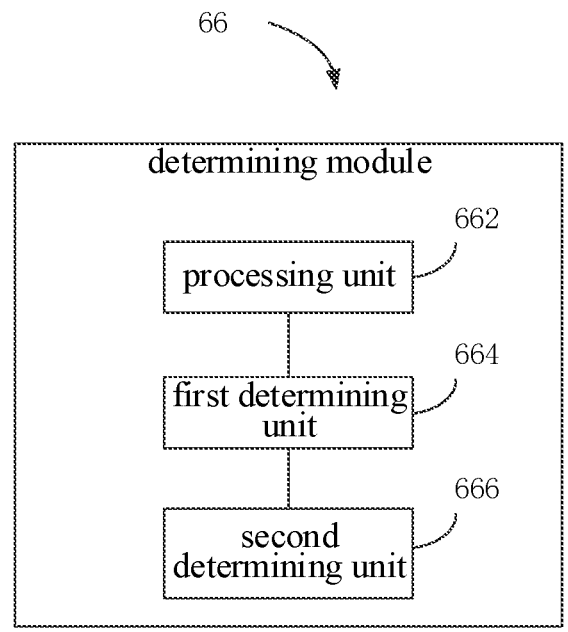
FIG. 23 is a schematic diagram of a determining module according to an embodiment of the present disclosure.

As illustrated in FIG. 23, in some embodiments, the determining module 66 includes a processing unit 662 and a first determining unit 664. The processing unit 662 is configured to, when the preset identifier does not exist in the laser pattern, process the laser pattern to determine whether a brightness of the human face in the laser pattern is within a preset brightness range. The first determining unit 664 is configured to determine that the laser projection component 10 is abnormal when the brightness of the human face is beyond the preset brightness range.

As illustrated in FIG. 21, in some embodiments, the processor 30 is configured to process the laser pattern when the preset identifier does not exist in the laser pattern to determine whether a brightness of the human face in the laser pattern is within a preset brightness range, and determine that the laser projection component 10 is abnormal when the brightness of the human face is beyond the preset brightness range.

That is, the act at block 067 can be implemented by the processing unit 662 or the processor 30, the act at block 068 can be implemented by the first determining unit 664 or the processor 30.

As illustrated in FIG. 23, in some embodiments, the determining module 66 includes a second determining unit 666. The second determining unit 666 is configured to determine that the depth camera component 100 is abnormal when the brightness of the human face is within a preset brightness range.

As illustrated in FIG. 21, in some embodiments, the processor 30 is configured to determine that the depth camera component 100 is abnormal when the brightness of the human face is within a preset brightness range.

That is, the act at block 069 can be implemented by the second determining unit 666 or the processor 30.

According to embodiments of the present disclosure, the preset identifier can be distributed in the laser pattern in many manners.

Figure 24:
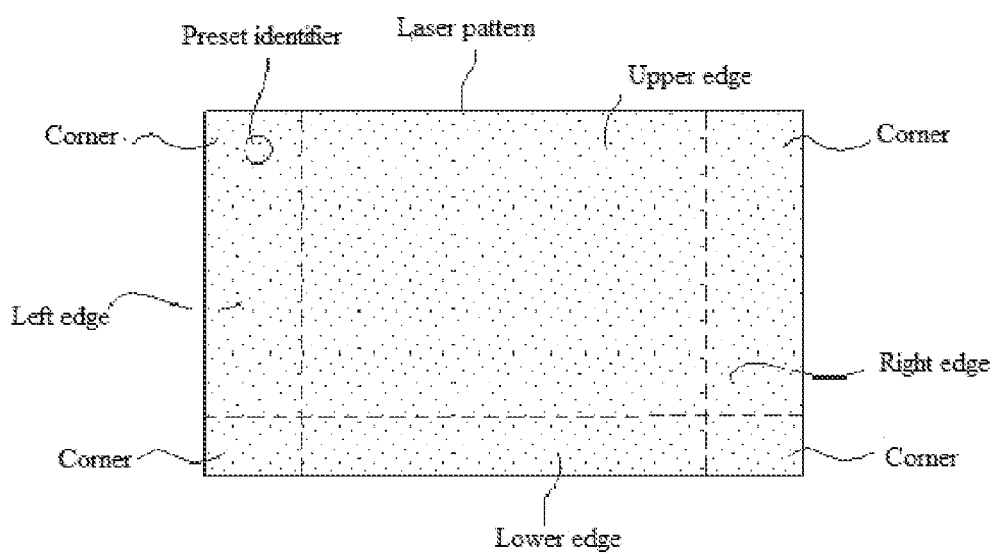
FIGS. 24 and 25 are schematic diagrams of a laser pattern according to embodiments of the present disclosure.
Figure 25:
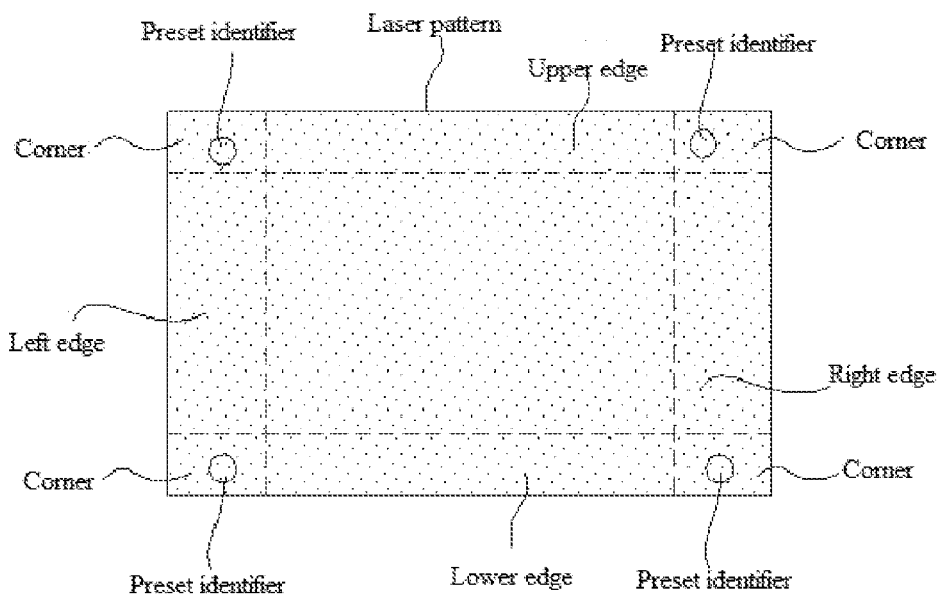

As illustrated in FIG. 24, in some embodiments, the preset identifier is single, and the single preset identifier may reduce the workload required by the detection device 60 or the processor 30 to determine whether the preset identifier exists in the laser pattern, thereby quickly determining whether the diffractive optical element 15 is abnormal. As illustrated in FIG. 25, in some embodiments, there may be a plurality of preset identifiers.

Figure 26:
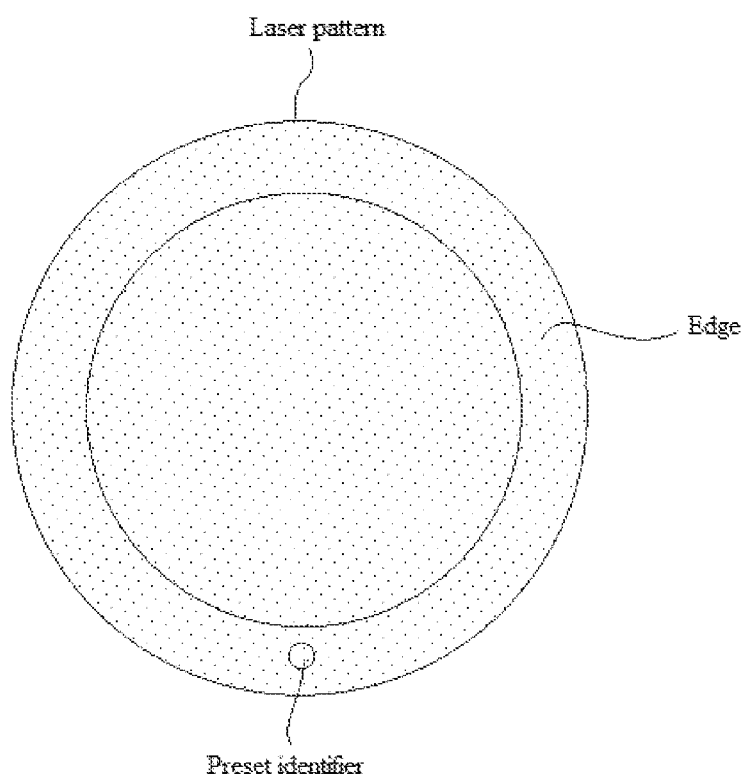
FIG. 26 is a schematic diagram of a laser pattern according to an embodiment of the present disclosure.

As illustrated in FIGS. 24-26, in some embodiments, the preset identifier is located at the corner or edge of the laser pattern. The preset identifier at the corner or edge can be used to more accurately determine whether the diffractive optical element 15 is abnormal.

In detail, when assembling the diffractive optical element 15, an edge region of the diffractive optical element 15 generally contacts with the mounting position. Therefore, when the diffractive optical element 15 is subjected to an external force, the edge region of the diffractive optical element 15 is subjected to a large stress and the edge region of the diffractive optical element 15 is relatively easy to be broken. The edge region of the diffractive optical element 15 corresponds to the corner or edge of the laser pattern, and thus, when the edge region of the diffractive optical element 15 is broken, it can be accurately known through the preset identifier located at the corner or edge of the laser pattern.

In some embodiments, the corner or edge of the laser pattern may refer to a region of the laser pattern that is at a distance from a center of the laser pattern greater than a predetermined distance.

As illustrated in FIGS. 24 and 25, the laser pattern is rectangular, the corner of the laser pattern may refer to four corners of the rectangle, and the edge of the laser pattern may refer to an upper edge, a lower edge, a left edge and a right edge of the rectangle.

As illustrated in FIG. 26, the laser pattern is circular, and the edge of the laser pattern may refer to an annular edge region.

The laser pattern may also have other shapes, and the preset identifier is disposed at the corner or edge of the laser pattern of other shapes.

In some embodiments, the preset identifier is located at at least one corner or edge of the laser pattern, and it may be understood that the preset identifier is located at one corner or edge of the laser pattern, or the preset identifiers are located at a plurality of corners or edges of the laser pattern.

As illustrated in FIGS. 24 and 26, in one embodiment, the preset identifier is single, and the single preset identifier is located at one corner or edge of the laser pattern.

As illustrated in FIG. 25, in another embodiment, the preset identifier is plural in number (for example, four), and the plurality of the preset identifiers are located at a plurality of corners or edges of the laser pattern (e.g., four preset identifiers are located at four corners of the laser pattern).

In other embodiments, the preset identifier may also be located at another position of the laser pattern except at the corner and edge, for example, at the center of the laser pattern, which is not limited herein.

Embodiments of the present disclosure also provide a depth camera component.

Figure 27:
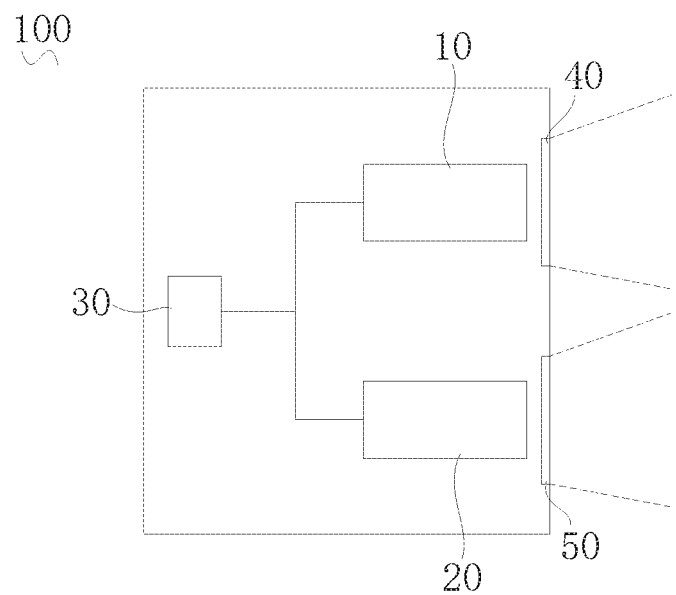
FIG. 27 is a schematic diagram of a depth camera component according to an embodiment of the present disclosure.

As illustrated in FIG. 27, the depth camera component 100 includes the laser projection component 10 and the image collector 20 of any of the above embodiments. A projection window 40 corresponding to the laser projection component 10 and a collection window 50 corresponding to the image collector 20 may be formed on the depth camera component 100. The laser projection component 10 is configured to project the laser pattern to a target space through the projection window 40, and the image collector 20 is configured to collect the laser pattern through the collection window 50. In one example, the laser light projected by the laser projection component 10 is infrared light, and the image collector 20 is an infrared camera.

In some embodiments, the detection device 60 or the processor 30 obtains the laser pattern, it is understood that the detection device 60 or the processor 30 obtains the laser pattern collected by the image collector 20.

In the description of the present disclosure, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples can be combined by those skilled in the art.

The flow chart or any process or method described herein in other manners may represent a module, segment, or portion of code that comprises one or more executable instructions to implement the specified logic function(s) or that comprises one or more executable instructions of the steps of the progress. Although the flow chart shows a specific order of execution, it is understood that the order of execution may differ from that which is depicted. For example, the order of execution of two or more boxes may be scrambled relative to the order shown.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method of the present disclosure may be achieved by commanding the related hardware with programs. The programs may be stored in a computer readable storage medium, and the programs comprise one or a combination of the steps in the method embodiments of the present disclosure when run on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer readable storage medium.

The storage medium mentioned above may be read-only memories, magnetic disks, CD, etc.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A detection method of a laser projection component, wherein the detection method is applied to an electronic device, and the electronic device comprises a visible light camera component and a depth camera component, the depth camera component comprises the laser projection component and an image collector, and a field of view of the visible light camera component and that of the image collector are at least partially overlapped, the laser projection component is applicable to the depth camera component and is configured to project a laser pattern, the detection method comprises:
    obtaining the laser pattern, including:
        obtaining a visible light image collected by the visible light camera component;
        determining whether a human face exists in the visible light image; and
        obtaining the laser pattern collected by the image collector when the human face exists in the visible light image;
    determining whether a preset identifier exists in the laser pattern; and
    determining that the depth camera component is abnormal when the preset identifier does not exist in the laser pattern.

2. The detection method of claim 1, further comprising:
    determining that the laser projection component is abnormal when the preset identifier does not exist in the laser pattern.

3. The detection method of claim 2, wherein,
    determining whether the preset identifier exists in the laser pattern, comprises: determining whether the preset identifier exists in each frame of the laser pattern;
    determining that the laser projection component is abnormal when the preset identifier does not exist in the laser pattern, comprises: determining that the laser projection component is abnormal when the preset identifier does not exist in any frame of the laser pattern.

4. The detection method of claim 2, wherein there are a plurality of preset identifiers;
    determining whether the preset identifier exists in the laser pattern, comprises: determining whether the plurality of preset identifiers exist in the laser pattern;
    determining that the laser projection component is abnormal when the preset identifier does not exist in the laser pattern, comprises: determining that the laser projection component is abnormal when at least one preset identifier does not exist in the laser pattern.

5. The detection method of claim 2, wherein the preset identifier is located at at least one corner or edge of the laser pattern.

6. The detection method of claim 1, wherein,
    obtaining the laser pattern, comprises: obtaining the laser pattern at a preset time.

7. The detection method of claim 6, wherein obtaining the laser pattern at the preset time, comprises:
    obtaining a moving speed of the laser projection component;
    determining whether the moving speed is greater than a preset speed; and
    obtaining the laser pattern when the moving speed is greater than the preset speed.

8. The detection method of claim 6, wherein obtaining the laser pattern at the preset time, comprises:
    obtaining the laser pattern at a preset time period.

9. The detection method of claim 1, wherein obtaining the laser pattern collected by the image collector when the human face exists in the visible light image, comprises:
    determining whether the human face is within a working range of the laser projection component based on a position of the human face in the visible light image, when the human face exists in the visible light image; and
    obtaining the laser pattern collected by the image collector when the human face is within the working range of the laser projection component.

10. The detection method of claim 1, further comprising:
    processing the laser pattern to determine whether a brightness of the human face in the laser pattern is within a preset brightness range, when the preset identifier does not exist in the laser pattern; and
    determining that the laser projection component is abnormal when the brightness of the human face is beyond the preset brightness range.

11. The detection method of claim 10, further comprising:
    determining that the depth camera component is abnormal when the brightness of the human face is within the preset brightness range.

12. The detection method of claim 1, wherein there are a plurality of preset identifiers;
    determining whether the preset identifier exists in the laser pattern, comprises: determining whether the plurality of preset identifiers exist in the laser pattern;
    determining that the depth camera component is abnormal when the preset identifier does not exist in the laser pattern, comprises: determining that the depth camera component is abnormal when at least one preset identifier does not exist in the laser pattern.

13. A laser projection component, comprising:
    a diffractive optical element, configured to diffract laser light to generate the laser pattern; and
    a processor, configured to perform the method of claim 1.

14. The laser projection component of claim 13, wherein the laser projection component comprises a light source and a collimating element, the light source is configured to emit the laser light, the collimating element is configured to collimate the laser light, and the diffractive optical element is configured to diffract the laser light collimated by the collimating element to generate the laser pattern.

15. The laser projection component of claim 14, wherein the light source comprises an edge-emitting laser, and the edge-emitting laser comprises a light emitting surface facing to the collimating element.

16. The laser projection component of claim 15, wherein the laser projection component further comprises a substrate assembly and a fixing member, the fixing member is configured to fix the edge-emitting laser to the substrate assembly.

17. The laser projection component of claim 16, wherein the fixing member comprises a sealant, the sealant is disposed between the edge-emitting laser and the substrate assembly, and the sealant is a thermal conductive adhesive.

18. The laser projection component of claim 16, wherein the fixing member comprises at least two elastic supporting frames disposed on the substrate assembly, the at least two elastic supporting frames collectively form a receiving space for receiving the edge-emitting laser, and the at least two elastic supporting frames are configured to support the edge-emitting laser.

19. An electronic device, comprising:

a visible light camera component and a processor;

wherein the depth camera component comprises a laser projection component and an image collector, wherein a field of view of the visible light camera component and that of the image collector are at least partially overlapped, and the laser projection component is configured to project the laser pattern; and a processor, configured to perform the method of claim 1;

wherein the processor is further configured to obtain a visible light image collected by the visible light camera component, determine whether a human face exists in the visible light image, and obtain the laser pattern collected by the image collector when the human face exists in the visible light image.

* * * * *